(12) United States Patent
Wei et al.

(10) Patent No.: US 10,644,259 B2
(45) Date of Patent: May 5, 2020

(54) PACKAGE OF ELECTRONIC DEVICE AND DISPLAY PANEL

(71) Applicants: Industrial Technology Research Institute, Hsinchu (TW); Intellectual Property Innovation Corporation, Hsinchu (TW)

(72) Inventors: Hsiao-Fen Wei, New Taipei (TW); Kun-Lin Chuang, Hsinchu (TW); Yen-Ching Kuo, Keelung (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 101 days.

(21) Appl. No.: 16/104,956

(22) Filed: Aug. 20, 2018

(65) Prior Publication Data

US 2019/0058158 A1    Feb. 21, 2019

Related U.S. Application Data

(60) Provisional application No. 62/547,118, filed on Aug. 18, 2017.

(30) Foreign Application Priority Data

Dec. 22, 2017 (TW) .............................. 106145424 A

(51) Int. Cl.
*H01L 51/52* (2006.01)
*H01L 51/56* (2006.01)
(Continued)

(52) U.S. Cl.
CPC ........ *H01L 51/5253* (2013.01); *H01L 27/323* (2013.01); *H01L 33/52* (2013.01); *H01L 51/56* (2013.01); *G02F 2001/133311* (2013.01)

(58) Field of Classification Search
CPC .......................... H01L 51/5253; H01L 27/323
(Continued)

(56) References Cited

U.S. PATENT DOCUMENTS 5,790,304 A    8/1998    Sanders et al.
6,949,389 B2    9/2005    Pichler et al.
(Continued)

FOREIGN PATENT DOCUMENTS

CN    1665352    9/2005
CN    1877411    12/2006
(Continued)

OTHER PUBLICATIONS

"Office Action of Taiwan Counterpart Application", dated Aug. 24, 2018, p. 1-p. 6.
(Continued)

*Primary Examiner* — Jami Valentine Miller
(74) *Attorney, Agent, or Firm* — JCIPRNET

(57) ABSTRACT

A package of electronic device including a substrate, at least one electronic device and an encapsulation layer is provided. The substrate has a device area and a light transmitting area located outside the device area. The at least one electronic device is disposed on the device area of the substrate. The encapsulation layer is disposed on the substrate and covers the at least one electronic device. The encapsulation layer extends continuously from the device area to the light transmitting area, and a nitrogen content of the encapsulation layer on the device area is higher than a nitrogen content of the encapsulation layer on the light transmitting area. A display panel is also provided.

20 Claims, 11 Drawing Sheets

(51) Int. Cl.
*H01L 27/32* (2006.01)
*H01L 33/52* (2010.01)
*G02F 1/1333* (2006.01)

(58) Field of Classification Search
USPC .......................................................... 257/88
See application file for complete search history.

(56) References Cited

U.S. PATENT DOCUMENTS

| | | | |
|---|---|---|---|
| 7,074,501 | B2 | 7/2006 | Czeremuszkin et al. |
| 9,093,669 | B2 | 7/2015 | Park et al. |
| 9,698,377 | B1 | 7/2017 | Wu et al. |
| 2003/0205845 | A1 | 11/2003 | Pichler et al. |
| 2011/0132449 | A1 | 6/2011 | Ramadas et al. |
| 2012/0015181 | A1 | 1/2012 | Seo et al. |
| 2012/0193816 | A1* | 8/2012 | Schmid ................ H01L 51/107 257/787 |
| 2012/0228603 | A1* | 9/2012 | Nakamura .......... H01L 51/5253 257/40 |
| 2013/0075740 | A1* | 3/2013 | Correia Fortunato ...................... H01L 21/02565 257/63 |
| 2013/0153880 | A1* | 6/2013 | Yamamoto .......... H01L 51/5246 257/40 |
| 2013/0168647 | A1* | 7/2013 | Diekmann ............. F21S 6/002 257/40 |
| 2013/0341629 | A1 | 12/2013 | Seo et al. |
| 2014/0179040 | A1 | 6/2014 | Ramadas et al. |
| 2014/0183479 | A1* | 7/2014 | Park ........................ H01L 51/56 257/40 |
| 2014/0319476 | A1* | 10/2014 | Lee ......................... H01L 27/32 257/40 |
| 2015/0307750 | A1 | 10/2015 | Nishijima et al. |
| 2017/0145249 | A1* | 5/2017 | Yun ....................... H01L 23/293 |
| 2019/0067627 | A1* | 2/2019 | Jia ........................ H01L 27/3241 |
| 2019/0198587 | A1* | 6/2019 | Park ....................... G09G 3/3266 |
| 2019/0306986 | A1* | 10/2019 | Lee ......................... H05K 1/111 |

FOREIGN PATENT DOCUMENTS

| | | |
|---|---|---|
| CN | 101409215 | 4/2009 |
| CN | 101743267 | 6/2010 |
| CN | 102790095 | 11/2012 |
| CN | 105556698 | 5/2016 |
| CN | 105720207 | 6/2016 |
| CN | 105073406 | 6/2017 |
| TW | 200703671 | 1/2007 |
| TW | 201008768 | 3/2010 |
| TW | 201143503 | 12/2011 |
| TW | 201318161 | 5/2013 |
| TW | 201324888 | 6/2013 |
| TW | 201404601 | 2/2014 |
| TW | 201430909 | 8/2014 |
| TW | 201546215 | 12/2015 |

OTHER PUBLICATIONS

"Office Action of Taiwan Related Application, application No. 107107532", dated Sep. 18, 2018, p. 1-p. 4.
"Office Action of Taiwan Counterpart Application", dated Feb. 23, 2018, p. 1-p. 3.
"Office Action of China Counterpart Application," dated Dec. 2, 2019, p. 1-p. 5.

* cited by examiner

PACKAGE OF ELECTRONIC DEVICE AND DISPLAY PANEL

CROSS-REFERENCE TO RELATED APPLICATION

This application claims the priority benefits of a U.S. provisional application Ser. No. 62/547,118, filed on Aug. 18, 2017 and a Taiwan application serial no. 106145424, filed on Dec. 22, 2017. The entirety of each of the above-mentioned patent applications is hereby incorporated by reference herein.

TECHNICAL FIELD

The disclosure relates to a package of electronic device and a display panel.

BACKGROUND

Along with development of technology, various display devices are continually developed. In some display devices, besides that a viewer may view images displayed on a display panel, the viewer may also see through the display panel to view a scene behind the display panel. These display devices are adaptable for commercial windows, head up display of vehicles and so on and thus gradually draw more and more attentions because of their light-transmitting characteristic.

If the overall transparency of a display device is too low, the user would observe the existence of the display device, which makes the background behind the display device unlikely to be seen clearly. In addition, it is an issue to improve the moisture and/or the oxygen barrier properties of electronic devices and display panels through the packaging technology, thereby enhancing the reliability and the lifetime of electronic devices and display panels.

SUMMARY

A package of electronic device according to an embodiment of the present disclosure includes a substrate, at least one electronic device and an encapsulation layer. The substrate has a device area and a light transmitting area located outside the device area. The at least one electronic device is disposed on the device area of the substrate. The encapsulation layer is disposed on the substrate and covers the at least one electronic device. The encapsulation layer extends continuously from the device area to the light transmitting area, and a nitrogen content of the encapsulation layer on the device area is higher than the nitrogen content of the encapsulation layer on the light transmitting area.

A package of electronic device according to another embodiment of the present disclosure includes a substrate, at least one electronic device and an encapsulation layer. The substrate has a device area and a light transmitting area located outside the device area. The at least one electronic device is disposed on the device area of the substrate. The encapsulation layer is disposed on the substrate and covers the at least one electronic device. A nitrogen content (N content) of the encapsulation layer on the device area is greater than or equal to 7 atomic percent (at %).

A display panel according to yet another embodiment of the present disclosure includes a display device and a driving circuit. The display device includes the aforementioned package of electronic device. The driving circuit is correspondingly disposed on the device area and electrically connected to the display device.

Several exemplary embodiments accompanied with figures are described in detail below to further describe the disclosure in details.

DETAILED DESCRIPTION OF DISCLOSED EMBODIMENTS

Figure 1A:
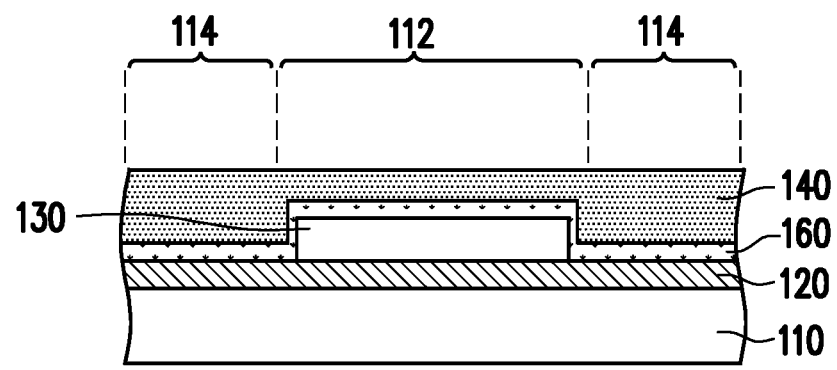
FIG. 1A to FIG. 1C are schematic cross-sectional views illustrating a manufacturing process of a package of electronic device according to a first embodiment of the disclosure.

Below, exemplary embodiments will be described in detail with reference to accompanying drawings to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
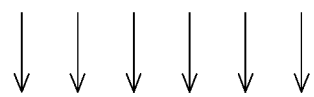
Figure 1B:
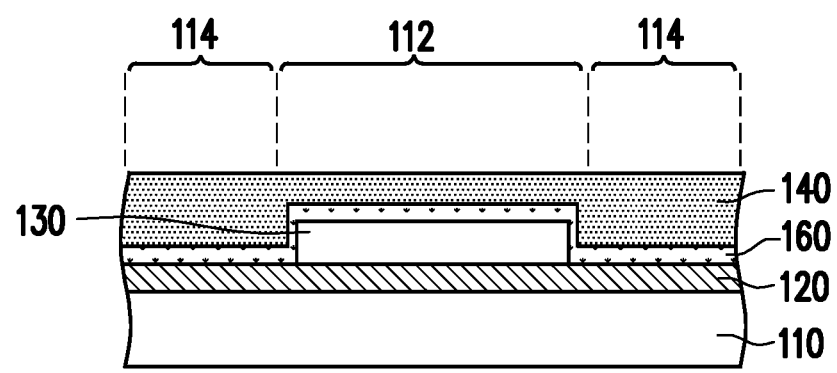
Figure 1C:
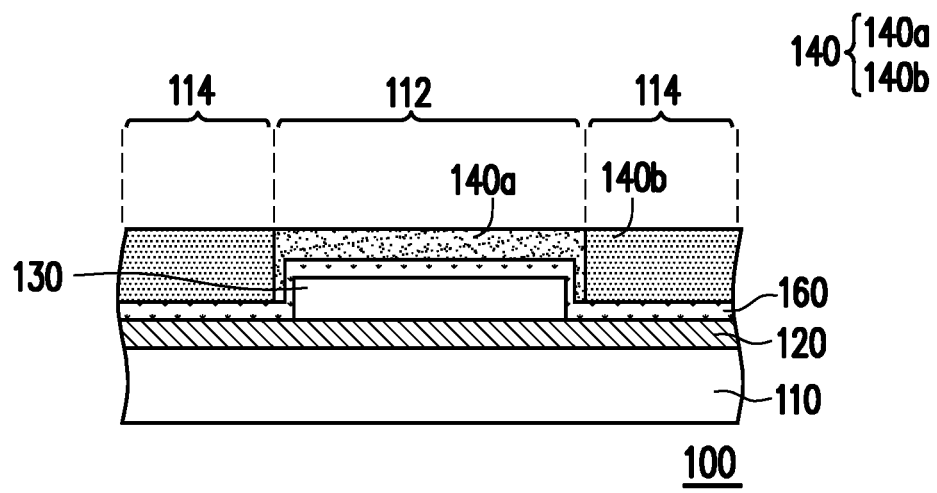

FIG. 1A to FIG. 1C are schematic cross-sectional views illustrating a manufacturing process of a package of electronic device according to a first embodiment of the disclosure. Referring to FIG. 1A, a substrate 110 is provided. The substrate 110 has a device area 112 and a light transmitting area 114 located outside the device area 112. The substrate 110 may be a rigid or flexible substrate with a transmittance of visible light. For example, materials of the rigid substrate may include glass or other rigid materials, and materials of the flexible substrate may include polyethylene terephthalate (PET), polyimide (PI), polycarbonate (PC), polyamide (PA), polyethylene naphthalate (PEN), polyethylenimine (PEI), polyurethane (PU), polydimethylsiloxane (PDMS), an acrylic-based polymer (for example, polymethylmethacrylate, PMMA), an ether-based polymer (for example, polyethersulfone, PES or polyetheretherketone, PEEK), polyolefin, metal foil, thin glass, or other flexible materials. However, the scope of the disclosure is not limited thereto.

Then, a buffer layer 120 may be selectively formed on the substrate 110, and an upper surface of the substrate 110 may be completely covered with the buffer layer 120. A material of the buffer layer 120 includes silicon nitride, silicon oxynitride, or a combination of the foregoing, or other transparent buffer material. But the scope of the disclosure is not limited thereto.

At least one electronic device 130 is formed on the buffer layer 120. The electronic device 130 is disposed on the device area 112 of the substrate 110. The at least one electronic device 130 may include a semiconductor device, a sensing device, a solar cell, a display device, or the like. The display device may be, for example, a liquid crystal display device, an organic light emitting device, an inorganic light emitting device, an electrophoretic display device, a quantum dot display device, or the like. But the scope of the disclosure is not limited thereto.

After the electronic device 130 is formed, an encapsulation layer 140 may be formed on the substrate 110 and the electronic device 130 by a solution process, and the encapsulation layer 140 may be cured. The encapsulation layer 140 is continuously extended from the device area 112 to the light transmitting area 114. The material of the encapsulation layer 140 may include, for example, polysilazane, polysiloxazane, or other suitable materials.

Referring to FIG. 1B, in this embodiment, the encapsulation layer 140 on the device area 112 may be locally modified by performing such as irradiation, heating, or plasma treatment to improve the barrier properties thereof, wherein the encapsulation layer 140 may adopt a hard mask or a patterning photoresist by such as a photolithographic etching process to achieve treatment at one or more specific locations. In one embodiment, the one or more specific locations where the localized treatment is performed may be, for example, above the at least one electronic device 130 or further extending to the surrounding of the side wall of the at least one electronic device 130, as shown in FIG. 1B. The irradiation treatment may be performed by using, for example, vacuum UV (VUV), and the heating treatment may be performed by using, for example, a hot plate, an oven, or the like. The gas used may include air, nitrogen ($N_2$), oxygen ($O_2$), and so on. The plasma treatment may be performed by using, for example, plasma-based ion implantation (PBII), gas used for the PBII includes inert gas, $H_2$, $N_2$, $O_2$, fluorine-containing gas, $Cl_2$, or and so on. A plasma energy and the time for the plasma treatment required for the PBII are, for example, not less than −2 kV and not less than 100 seconds, respectively. The materials for the locally modified encapsulation layer 140 may include, for example, silicon nitride, silicon oxynitride, silicon oxide, or other suitable materials.

In one embodiment, a cover layer 160 may be selectively formed on the electronic device 130 before the encapsulation layer 140 is formed, and the method for forming the cover layer 160 may be, for example, ink-jet printing (IJP), plasma-enhanced chemical vapor deposition (PECVD), physical vapor deposition (PVD), sputter deposition, atomic layer deposition (ALD) or other suitable methods. The materials for the cover layer 160 may include, for example, SiOx, SiNx, AlOx, SiON, indium zinc oxide (IZO), and a polymer such as acrylic or other suitable materials. The cover layer 160 may also be selectively formed on the at least one electronic device 130 before the encapsulation layer 140 is formed in the following embodiments, per their respective requirements of the embodiments.

Referring to FIG. 1C, the encapsulation layer 140 on the device area 112 is treated to form an encapsulation layer 140 having a first nitrogen-rich area 140a. The material of the encapsulation layer 140 is, for example, silicon nitride or silicon oxynitride, also, the first nitrogen-rich area 140a may cover the top surface and sidewalls of the at least one electronic device 130; the encapsulation layer 140 on the light transmitting area 114 is without being treated and is the encapsulation layer 140 having a first oxygen-rich area 140b. A nitrogen content (N content) of the first nitrogen-rich area 140a is higher than a nitrogen content of the first oxygen-rich area 140b, and its nitrogen content is, for example, greater than or equal to 7 atomic percent (at %), thus the nitrogen content of the encapsulation layer 140 on the device area 112 is higher than the nitrogen content of the encapsulation layer 140 on the light transmitting area 114. With the barrier characteristics of the material of the first nitrogen-rich area 140a in the encapsulation layer 140, a water vapor transmission rate (WVPR) of the first nitrogen-rich area 140a is, for example, lower than or equal to $10^{-2}$ g/$m^2$-day or lower than or equal to $10^{-4}$ g/$m^2$-day preferably.

Furthermore, the first oxygen-rich area 140b that is not treated on the light transmitting area 114 has a higher oxygen content (O content), and the light transmittance of the first oxygen-rich area 140b may be higher than the light transmittance of the first nitrogen-rich area 140a, and the light transmittance of the first oxygen-rich area 140b may be, for example, greater than or equal to 80%. Therefore, the package of electronic device 100 may have barrier characteristics in the device area 112 and may have a high light transmittance in the light transmitting area 114. In addition, in consideration of the flexibility of the package of electronic device 100, a Young's modulus of the encapsulation layer 140 may be, for example, 3 GPa to 10 GPa. The aforesaid technical characteristics may be adjusted and designed in the following embodiments, per their respective requirements of these embodiments.

In an embodiment, energy dispersive spectroscopy (EDS), X-ray photoelectron spectroscopy (XPS), or other suitable methods may be used to analyze components of the first nitrogen-rich area 140a and/or the first oxygen-rich area 140b of the encapsulation layer 140. The energy dispersive spectroscopy may be attached to equipment such as scanning electron microscopy (SEM) or transmission electron microscopy (TEM) and using, for example, a line scan or a single point measurement for elemental analysis. The nitrogen content may be greater than 7 at % as compared to other elemental composition in the measurement region; the X-ray photoelectron spectroscopy may use, for example, a single point measurement or a depth measurement for elemental analysis, and the nitrogen content may be known as compared with other elemental composition in the measurement region.

Figure 2:
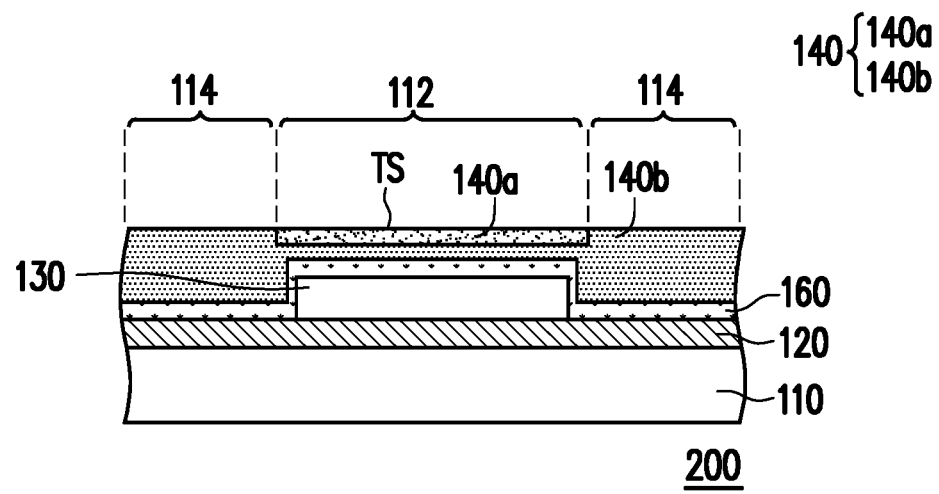
FIG. 2 is a schematic cross-sectional view illustrating a package of electronic device according to a second embodiment of the disclosure.

FIG. 2 is a schematic cross-sectional view illustrating a package of electronic device according to a second embodiment of the disclosure. A package of electronic device 200 in the second embodiment is similar to the package of electronic device 100 of FIG. 1A to FIG. 1C. In FIG. 2, like or similar reference numerals represent like or similar components. Thus, components already described in FIG. 1A to FIG. 1C will not be described in the following.

In this second embodiment of FIG. 2, the encapsulation layer 140 of the package of electronic device 200 may be locally modified on the device area 112 by irradiation, heating, plasma treatment, and so on, and the depth of modification of the encapsulation layer 140 may be reduced by decreasing treatment energy and/or treatment time to form a gradient of nitrogen content that gradually decreases from a treated surface TS towards the at least one electronic device 130. The nitrogen content of the first nitrogen-rich area 140a is higher than the nitrogen content of the first oxygen-rich area 140b. Compared with the first nitrogen-rich area 140a, the first oxygen-rich area 140b located on the light transmitting area 114 and the device area 112 those are near one side of the electronic device 130 has a higher oxygen content and a light transmittance. The package of electronic device 200 may have barrier characteristics in the device area 112 and a high light transmittance in the light transmitting area 114.

In other embodiments, the packages of electronic device 100 and 200 may be subjected to a secondary modification treatment to further enhance the barrier characteristics, that is, the surface of the light transmitting area 114 or the full encapsulating layer 140 may be locally modified by such as irradiation, heating, or plasma treatment. The depth of the modification of the encapsulation layer 140 may be reduced by decreasing treatment energy and/or treatment time to form a gradient of nitrogen content that gradually decreases from the treated surface TS towards the at least one electronic device 130. In one embodiment, the depth of the secondary modification treatment may be shallower than that of the packages of electronic devices 100 and 200 respectively shown in FIG. 1C and FIG. 2, so that the thickness of the first oxygen-rich area 140b on the light transmitting area 114 is greater than the thickness of the first oxygen-rich area 140b on the device area 112. In the following embodiments, similar secondary modification treatments may be performed, per their respective requirements of these embodiments.

FIG. 3A to FIG. 3E are schematic cross-sectional views illustrating a manufacturing process of a package of electronic device according to a third embodiment of the disclosure. In FIG. 3A to FIG. 3E, like or similar reference numerals represent like or similar components. Thus, components already described in FIG. 1A to FIG. 1C will not be described in the following.

Figure 3A:
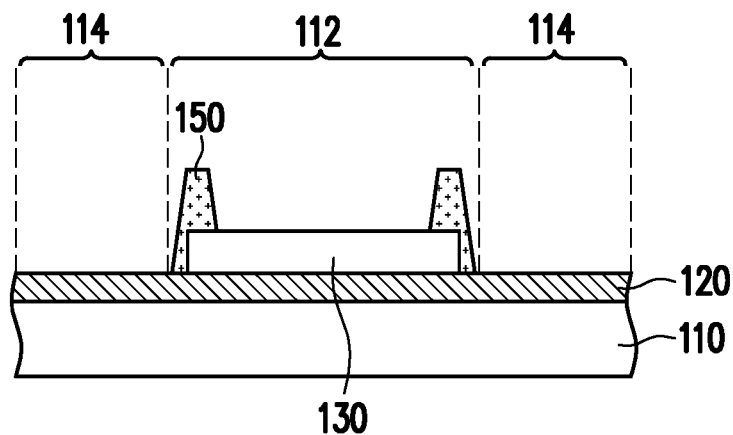
FIG. 3A to FIG. 3E are schematic cross-sectional views illustrating a manufacturing process of a package of electronic device according to a third embodiment of the disclosure.

Referring to FIG. 3A, after the at least one electronic device 130 is formed, a first retaining wall 150 is disposed around the at least one electronic device 130. The first retaining wall 150 is located on the device area 112 and may cover the sidewall of the at least one electronic device 130. In one embodiment, the cross-section of the first retaining wall 150 may have a rectangular shape, a trapezoidal shape, or other suitable shapes. The method for forming the first retaining wall 150 may be, but not limited to, spraying, screen printing, microlithography, and low-temperature sintering or other suitable methods.

Figure 3B:
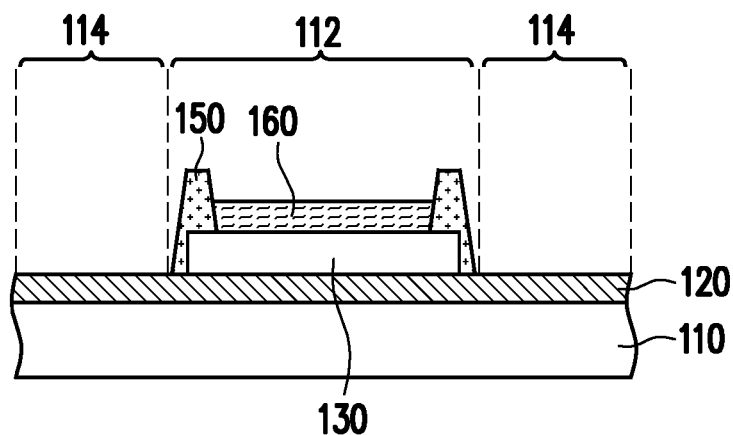

Referring to FIG. 3B, a cover layer 160 may be selectively formed on the electronic device 130 and the area surrounded by the first retaining wall 150. The method for forming the cover layer 160 may be, for example, ink-jet printing (IJP). The material of the cover layer 160 may, for example, include an acrylic-based polymer or other suitable materials.

Figure 3C:
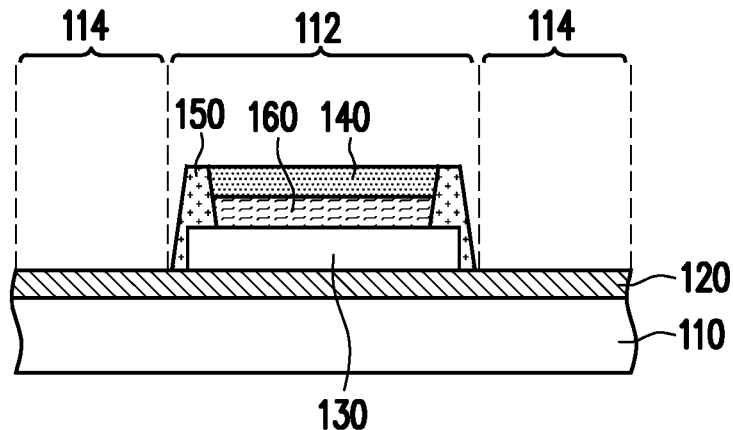

Referring to FIG. 3C, the encapsulation layer 140 may be formed on the cover layer 160 and the area surrounded by the first retaining wall 150 by, for example, ink jet printing, and then the encapsulation layer 140 may be cured. The material of the encapsulation layer 140 may include, for example, polysilazane, polysiloxazane, or other suitable materials. As shown in FIG. 3C, the cover layer 160 is located between the at least one electronic device 130 and the encapsulation layer 140.

Figure 3D:
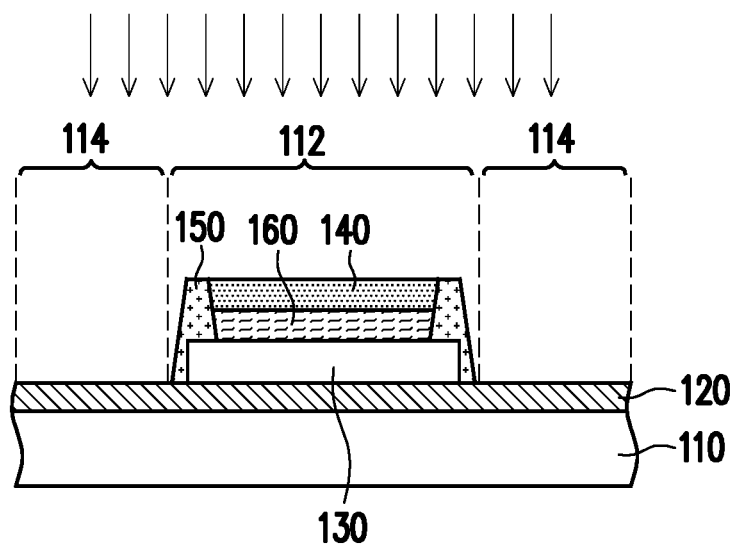

Referring to FIG. 3D, in the embodiment, the encapsulation layer 140 on the device area 112 may be modified by performing irradiation, heating, or plasma treatment to improve the barrier properties thereof. The irradiation treatment may be performed by using, for example, vacuum UV (VUV). The plasma treatment may be performed by using, for example, plasma-based ion implantation (PBII).

Figure 3E:
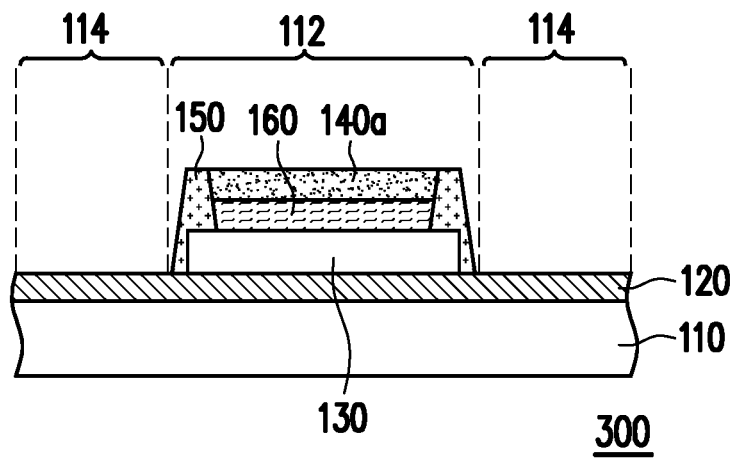

Referring to FIG. 3E, the aforementioned encapsulation layer 140 on the device area 112 is treated to form an encapsulation layer 140 having a first nitrogen-rich area 140a, the material of which is, for example, silicon nitride or silicon oxynitride. The first nitrogen-rich area 140a has a high nitrogen content, and the nitrogen content is, for example, greater than or equal to 7 at %. With the barrier characteristics of the material of the first nitrogen-rich area 140a in the encapsulation layer 140, a water vapor transmission rate (WVPR) of the first nitrogen-rich area 140a is, for example, lower than or equal to $10^{-2}$ g/m$^2$-day or lower than or equal to $10^{-4}$ g/m$^2$-day preferably. Moreover, the light transmitting area 114 does not include such as the components on the device area 112 and may have a higher light transmittance than that of the device area 112. The higher light transmittance may be, for example, 80% or more. Therefore, the package of electronic device 300 may have barrier characteristics in the device area 112 and a high light transmittance in the light transmitting area 114.

Figure 4:
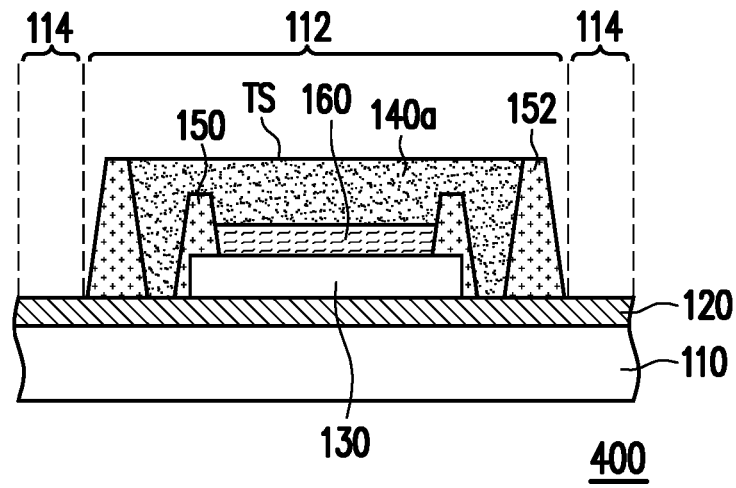
FIG. 4 is a schematic cross-sectional view illustrating a package of electronic device according to a fourth embodiment of the disclosure.

FIG. 4 is a schematic cross-sectional view illustrating a package of electronic device according to a fourth embodiment of the disclosure. A package of electronic device 400 of the fourth embodiment shown in FIG. 4 is similar to the package of electronic device 300 of FIG. 3A to FIG. 3E. In FIG. 4, like or similar reference numerals represent like or similar components. Thus, components already described in FIG. 3A to FIG. 3E will not be described in the following.

In this fourth embodiment, the package of electronic device 400 further includes a second retaining wall 152. The second retaining wall 152 is located on the device area 112 and is disposed outside and surrounding the first retaining wall 150. The encapsulation layer 140 may be formed on the at least one electronic device 130 and the area surrounded by the first retaining wall 150 and the second retaining wall 152 by using, for example, ink jet printing, and then the encapsulation layer 140 may be cured. Next, the encapsulation layer 140 on the device area 112 may be modified by performing such as irradiation, heating, or plasma treatment to improve the barrier properties thereof. The irradiation treatment may be performed by using, for example, vacuum UV (VUV). The plasma treatment may be performed by using, for example, plasma-based ion implantation (PBII). In one embodiment, the depth of the modification of the encapsulation layer 140 may be reduced by decreasing treatment energy and/or treatment time to form a gradient of nitrogen content that gradually decreases from the treated surface TS towards the at least one electronic device 130. The aforementioned encapsulation layer 140 on the device area 112 is treated to form an encapsulation layer 140 having a first nitrogen-rich area 140a, and the material of which is, for example, silicon nitride or silicon oxynitride. The first nitrogen-rich area 140a has a high nitrogen content, and the high nitrogen content is, for example, greater than or equal to 7 at %. Moreover, the light transmitting area 114 does not include the components on the device area 112 and may have a higher light transmittance than that of the device area 112, and the higher light transmittance may be, for example, 80% or more. Therefore, the package of electronic device 400 may have barrier characteristics in the device area 112 and a high light transmittance in the light transmitting area 114.

The encapsulation layer in the foregoing embodiments is taking a single layer structure as an example, but it may have a multi-layer stack structure. This multi-layer stack structure is advantageous for improving the barrier effect of the package of electronic device. In addition, the materials of the multi-layer stack structure have a high compatibility with each other, and the interface problems between the layers may be avoided when each of the layers is stacked. The encapsulation layer of a multi-layer stack structure may refer to the following embodiments.

Figure 5:
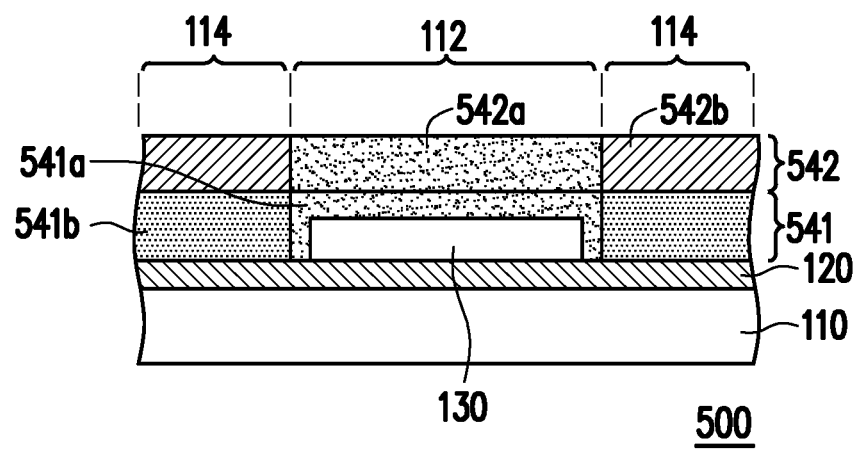
FIG. 5 is a schematic cross-sectional view illustrating a package of electronic device according to a fifth embodiment of the disclosure.

FIG. 5 is a schematic cross-sectional view illustrating a package of electronic device according to a fifth embodiment of the disclosure. A package of electronic device 500 of the fifth embodiment is similar to the package of electronic device 100 of FIG. 1A to FIG. 1C. In FIG. 5, like or similar reference numerals represent like or similar components. Thus, components already described in FIG. 1A to FIG. 1C will not be described in the following.

In this fifth embodiment, the encapsulation layer 540 of the package of electronic device 500 may include a first barrier layer 541 and a second barrier layer 542. The first barrier layer 541 and the second barrier layer 542 are continuously extended from the device area 112 to the light transmitting area 114. The materials of the first barrier layer 541 and the second barrier layer 542 may include, for example, polysilazane, polysiloxazane, or other suitable materials.

First, the first barrier layer 541 disposed on the device area 112 may be locally modified by performing a similar treatment (for example, irradiation, heating, plasma treatment, and so on) as in the first embodiment to improve the barrier properties thereof. After treatment, the first barrier layer 541 having a first nitrogen-rich area 541a is formed, and the material of which is, for example, silicon nitride or silicon oxynitride. The first nitrogen-rich area 541a may cover the top surface and sidewalls of the at least one electronic device 130. While the first barrier layer 541 without being treated on the light transmitting area 114 is the first barrier layer 541 having a first oxygen-rich area 541b. A nitrogen content of the first nitrogen-rich area 541a is higher than a nitrogen content of the first oxygen-rich area 541b, and the higher nitrogen content is, for example, greater than or equal to 7 at %. With the barrier characteristics of the material of the first nitrogen-rich area 541a in the first barrier layer 541, a water vapor transmission rate (WVPR) of the first nitrogen-rich area 541a is, for example, lower than or equal to $10^{-2}$ g/m²-day or lower than or equal to $10^{-4}$ g/m²-day preferably. Moreover, compared with first nitrogen-rich area 541a, the the first oxygen-rich area 541b without being treated on the light transmitting area 114 has a higher oxygen content and may have a higher light transmittance, the higher light transmittance may be, for example, 80% or more.

Next, a second barrier layer 542 is formed on the first barrier layer 541, wherein the second barrier layer 542 disposed on the device area 112 may be locally modified by performing a similar treatment (for example, irradiation, heating, plasma treatment, and so on) as in the first barrier layer 541 to improve the barrier properties thereof. After treatment, the first barrier layer 541 having a first nitrogen-rich area 541a is formed, the material of which may be similar to that of the first nitrogen-rich area 541a, for example. The second barrier layer 542 without being treated on the light transmitting area 114 is the second barrier layer 542 having a second oxygen-rich area 542b. A nitrogen content of the second nitrogen-rich area 542a is higher than a nitrogen content of the second oxygen-rich area 542b. Moreover, compared with the second nitrogen-rich area 542a, the second oxygen-rich area 542b without being treated on the light transmitting area 114 has a higher oxygen content and may have a higher light transmittance. Therefore, the package of at least one electronic device 500 may have barrier characteristics in the device area 112 and a high light transmittance in the light transmitting area 114.

Figure 6:
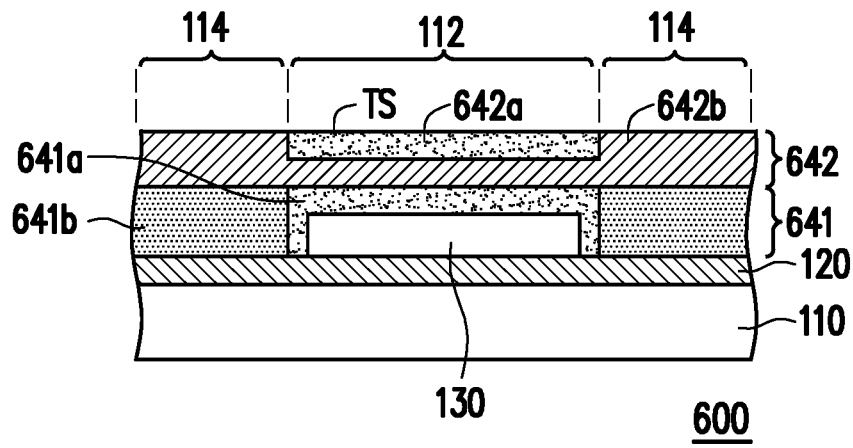
FIG. 6 is a schematic cross-sectional view illustrating a package of electronic device according to a sixth embodiment of the disclosure.

FIG. 6 is a schematic cross-sectional view illustrating a package of electronic device according to a sixth embodiment of the disclosure. A package of electronic device 600 of the sixth embodiment is similar to the package of electronic device 500 of FIG. 5. In FIG. 6, like or similar reference numerals represent like or similar components. Thus, components already described in FIG. 5 will not be described in the following.

In this sixth embodiment, the encapsulation layer 640 of the package of electronic device 600 may include a first barrier layer 641 and a second barrier layer 642, and the second barrier layer 642 are continuously extended from the device area 112 to the light transmitting area 114. The first barrier layer 641 may be similar to the first barrier layer 541 of the fifth embodiment. Afterwards, the second barrier layer 642 is formed on the first barrier layer 641. The second barrier layer 642 on the device area 112 may be locally modified by performing such as irradiation, heating, or plasma treatment to improve the barrier properties thereof. The depth of modification of the second barrier layer 642 may be reduced by decreasing treatment energy and/or treatment time to form a gradient of nitrogen content that gradually decreases from the treated surface TS towards the at least one electronic device 130. A nitrogen content of the second nitrogen-rich area 642a is higher than a nitrogen content of the second oxygen-rich area 642b. Compared with the second nitrogen-rich area 642a, the second oxygen-rich area 642b located on the light transmitting area 114 and the device area 112 those are near one side of the electronic device 130 has a higher oxygen content and a higher light transmittance.

Figure 7:
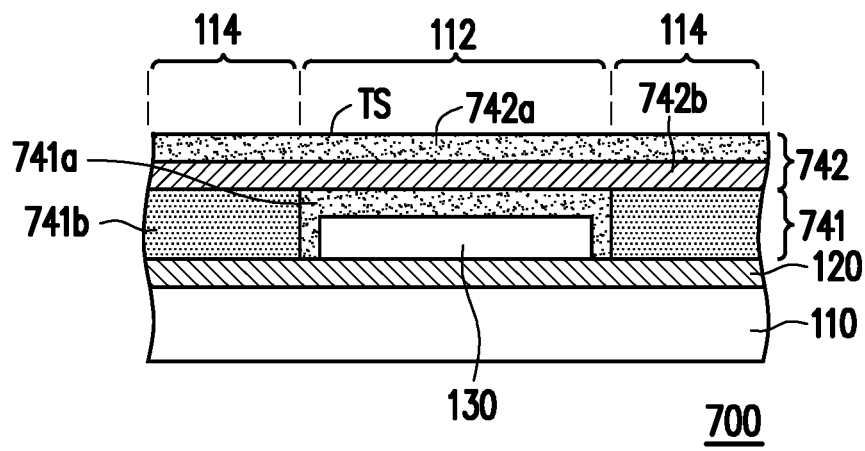
FIG. 7 is a schematic cross-sectional view illustrating a package of electronic device according to a seventh embodiment of the disclosure.

FIG. 7 is a schematic cross-sectional view illustrating a package of electronic device according to a seventh embodiment of the disclosure. A package of electronic device 700 of the seventh embodiment is similar to the package of electronic device 500 of FIG. 5. In FIG. 7, like or similar reference numerals represent like or similar components. Thus, components already described in FIG. 5 will not be described in the following.

In this seventh embodiment, the encapsulation layer 740 of the package of electronic device 700 may include a first barrier layer 741 and a second barrier layer 742, wherein the first barrier layer 741 and the second barrier layer 742 are continuously extended from the device area 112 to the light transmitting area 114. The first barrier layer 741 may be similar to the first barrier layer 541 of the fifth embodiment. Afterwards, the second barrier layer 742 is formed on the first barrier layer 741. The second barrier layer 742 may be fully modified by performing such as irradiation, heating, or plasma treatment to improve the barrier properties thereof. The depth of modification of the second barrier layer 742 may be reduced by decreasing treatment energy and/or treatment time to form a gradient of nitrogen content that gradually decreases from the treated surface TS towards the at least one electronic device 130. A nitrogen content of the second nitrogen-rich area 742a is higher than a nitrogen content of the second oxygen-rich area 742b. Compared with the second nitrogen-rich area 742a, the second oxygen-rich area 742b located near one side of the electronic device 130 has a higher oxygen content and a higher light transmittance.

Figure 8:
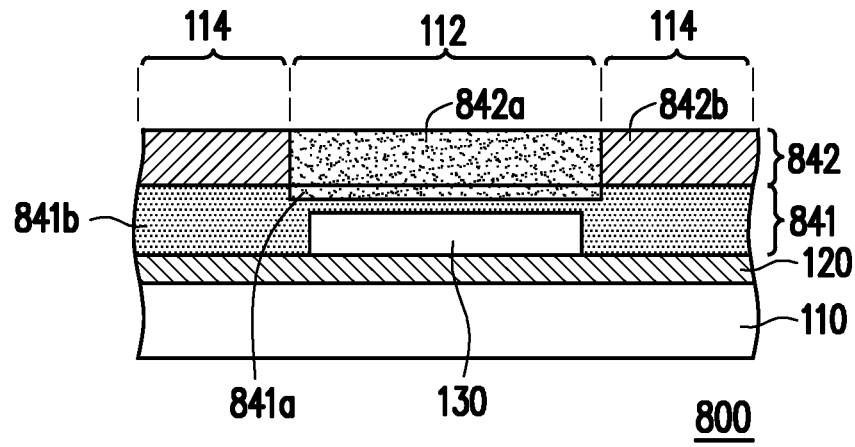
FIG. 8 is a schematic cross-sectional view illustrating a package of electronic device according to an eighth embodiment of the disclosure.

FIG. 8 is a schematic cross-sectional view illustrating a package of electronic device according to an eighth embodiment of the disclosure. A package of electronic device 800 of the eighth embodiment is similar to the package of electronic device 500 of FIG. 5. In FIG. 8, like or similar reference numerals represent like or similar components. Thus, components already described in FIG. 5 will not be described in the following.

In this eighth embodiment, the encapsulation layer 840 of the package of electronic device 800 may include a first barrier layer 841 and a second barrier layer 842. The first barrier layer 841 is formed on the at least one electronic device 130. The first barrier layer 841 on the device area 112 may be locally modified by performing such as irradiation, heating, or plasma treatment to improve the barrier properties thereof. The depth of modification of the first barrier layer 841 may be reduced by decreasing treatment energy and/or treatment time to form a gradient of nitrogen content. A nitrogen content of the first nitrogen-rich area 841a is higher than a nitrogen content of the first oxygen-rich area 841b. Compared with the first nitrogen-rich area 841a, the first oxygen-rich area 841b located on the light transmitting area 114 and the device area 112 those are near one side of the electronic device 130 has a higher oxygen content and a light transmittance. Then, the second barrier layer 842 is formed on the first barrier layer 841, wherein the second barrier layer 842 may be similar to the second barrier layer 542 of the fifth embodiment. Therefore, the package of electronic device 800 may have barrier characteristics in the device area 112 and a high light transmittance in the light transmitting area 114.

Figure 9:
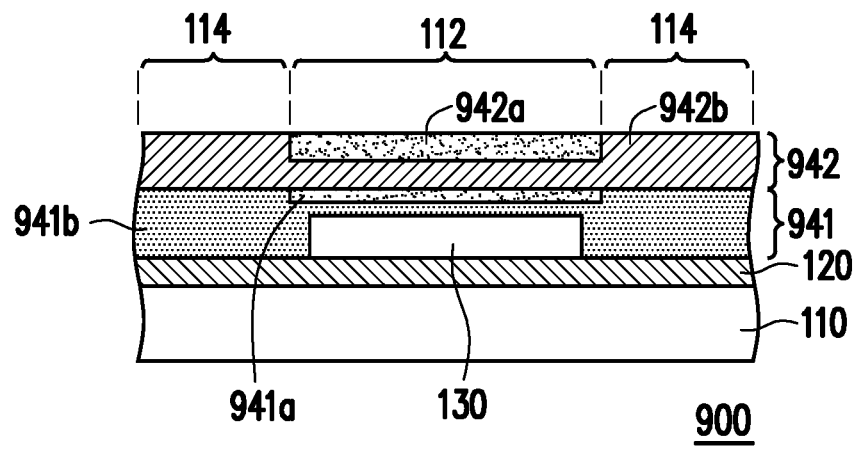
FIG. 9 is a schematic cross-sectional view illustrating a package of electronic device according to a ninth embodiment of the disclosure.

FIG. 9 is a schematic cross-sectional view illustrating a package of electronic device according to a ninth embodiment of the disclosure. A package of electronic device 900 of the ninth embodiment is similar to the package of electronic device 800 of FIG. 8. In FIG. 9, like or similar reference numerals represent like or similar components. Thus, components already described in FIG. 8 will not be described in the following.

In this ninth embodiment, the encapsulation layer 940 of the package of electronic device 900 may include a first barrier layer 941 and a second barrier layer 942, wherein the first barrier layer 941 may be similar to the first barrier layer 841 of the eighth embodiment. Then, the second barrier layer 942 is formed on the first barrier layer 941. The second barrier layer 942 on the device area 112 may be locally modified by performing such as irradiation, heating, or plasma treatment to improve the barrier properties thereof. The depth of modification of the second barrier layer 942 may be reduced by decreasing treatment energy and/or treatment time to form a gradient of nitrogen content. A nitrogen content of the second nitrogen-rich area 942a is higher than a nitrogen content of the second oxygen-rich area 942b. Compared with the second nitrogen-rich area 942a, the second oxygen-rich area 942b located on the light transmitting area 114 and the device area 112 those are near one side of the electronic device 130 has a higher oxygen content and a higher light transmittance.

Figure 10:
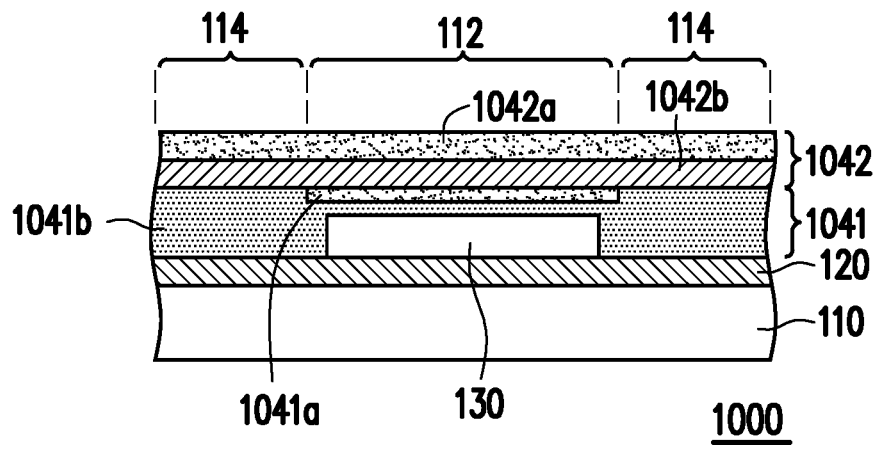
FIG. 10 is a schematic cross-sectional view illustrating a package of electronic device according to a tenth embodiment of the disclosure.

FIG. 10 is a schematic cross-sectional view illustrating a package of electronic device according to a tenth embodiment of the disclosure. A package of electronic device 1000 of the tenth embodiment is similar to the package of electronic device 800 of FIG. 8. In FIG. 10, like or similar reference numerals represent like or similar components. Thus, components already described in FIG. 8 will not be described in the following.

In this tenth embodiment, the encapsulation layer 1040 of the package of electronic device 1000 may include a first barrier layer 1041 and a second barrier layer 1042, wherein the first barrier layer 1041 may be similar to the first barrier layer 841 of the eighth embodiment. Then, the second barrier layer 1042 is formed on the first barrier layer 1041. The second barrier layer 1042 may be fully modified by performing such as irradiation, heating, or plasma treatment to improve the barrier properties thereof. The depth of modification of the second barrier layer 1042 may be reduced by decreasing treatment energy and/or treatment time to form a gradient of nitrogen content. A nitrogen content of the second nitrogen-rich area 1042a is higher than a nitrogen content of the second oxygen-rich area 1042b. Compared with the second nitrogen-rich area 1042a, the second oxygen-rich area 1042b located near one side of the electronic device 130 has a higher oxygen content and a higher light transmittance.

Figure 11:
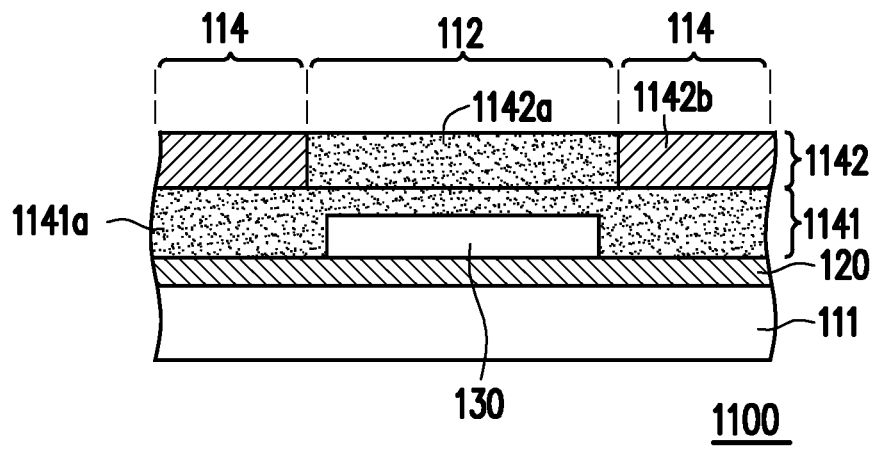
FIG. 11 is a schematic cross-sectional view illustrating a package of electronic device according to an eleventh embodiment of the disclosure.

FIG. 11 is a schematic cross-sectional view illustrating a package of electronic device according to an eleventh embodiment of the disclosure. A package of electronic device 1100 of the eleventh embodiment is similar to the package of electronic device 500 of FIG. 5. In FIG. 11, like or similar reference numerals represent like or similar components. Thus, components already described in FIG. 5 will not be described in the following.

In this eleventh embodiment, the encapsulation layer 1140 of the package of electronic device 1100 may include a first barrier layer 1141 and a second barrier layer 1142. The first barrier layer 1141 is formed on the at least one electronic device 130. The of the first barrier layer 1141 may be fully modified by performing such as irradiation, heating, or plasma treatment to improve the barrier properties thereof. Then, the second barrier layer 1142 is formed on the first barrier layer 1141, wherein the second barrier layer 1142 may be similar to the second barrier layer 542 of the fifth embodiment. Therefore, the package of electronic device 1100 may have barrier characteristics in the device area 112 and a high light transmittance in the light transmitting area 114.

Figure 12:
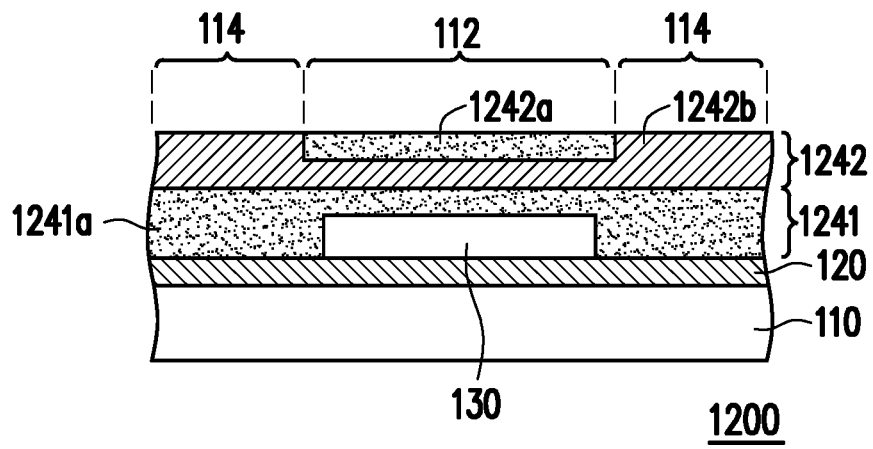
FIG. 12 is a schematic cross-sectional view illustrating a package of electronic device according to a twelfth embodiment of the disclosure.

FIG. 12 is a schematic cross-sectional view illustrating a package of electronic device according to a twelfth embodiment of the disclosure. A package of electronic device 1200 of the twelfth embodiment is similar to the package of electronic device 1100 of FIG. 11. In FIG. 12, like or similar reference numerals represent like or similar components. Thus, components already described in FIG. 11 will not be described in the following.

In this twelfth embodiment, the encapsulation layer 1240 of the package of electronic device 1200 may include a first barrier layer 1241 and a second barrier layer 1242, the first barrier layer 1241 may be similar to the first barrier layer 1141 of the eleventh embodiment. Then, the second barrier layer 1242 is formed on the first barrier layer 1241. The second barrier layer 1242 on the device area 112 may be locally modified by performing such as irradiation, heating, or plasma treatment to improve the barrier properties thereof. The depth of modification of the second barrier layer 1242 may be reduced by decreasing treatment energy and/or treatment time to form a gradient of nitrogen content. A nitrogen content of the second nitrogen-rich area 1242a is higher than a nitrogen content of the second oxygen-rich area 1242b. Compared with the second nitrogen-rich area 1242a, the second oxygen-rich area 1242b located on the light transmitting area 114 and the device area 112 those are near one side of the at least one electronic device 130 has a higher oxygen content and a higher light transmittance.

Figure 13:
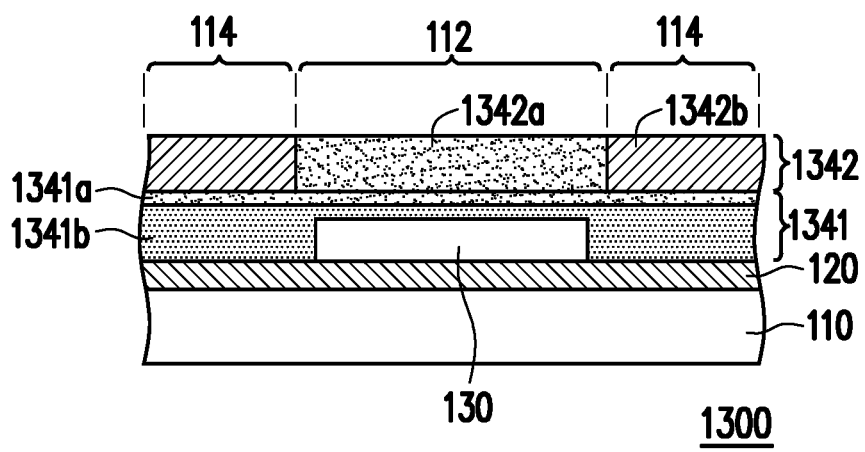
FIG. 13 is a schematic cross-sectional view illustrating a package of electronic device according to a thirteenth embodiment of the disclosure.

FIG. 13 is a schematic cross-sectional view illustrating a package of electronic device according to a thirteenth embodiment of the disclosure. A package of electronic device 1300 of the thirteenth embodiment is similar to the package of electronic device 500 of FIG. 5. In FIG. 13, like or similar reference numerals represent like or similar components. Thus, components already described in FIG. 5 will not be described in the following.

In this thirteenth embodiment, the encapsulation layer 1340 of the package of electronic device 1300 may include a first barrier layer 1341 and a second barrier layer 1342. The first barrier layer 1341 is formed on the at least one electronic device 130. The first barrier layer 1341 may be fully modified by performing such as irradiation, heating, or plasma treatment to improve the barrier properties thereof. The depth of modification of the first barrier layer 1341 may be reduced by decreasing treatment energy and/or treatment time to form a gradient of nitrogen content. A nitrogen content of the first nitrogen-rich area 1341a is higher than a nitrogen content of the first oxygen-rich area 1341b. Compared with the first nitrogen-rich area 1341a, the first oxygen-rich area 1341b located near one side of the electronic device 130 has a higher oxygen content and a higher light transmittance. Then, the second barrier layer 1342 is formed on the first barrier layer 1341, wherein the second barrier layer 1342 may be similar to the second barrier layer 542 of the fifth embodiment.

Figure 14:
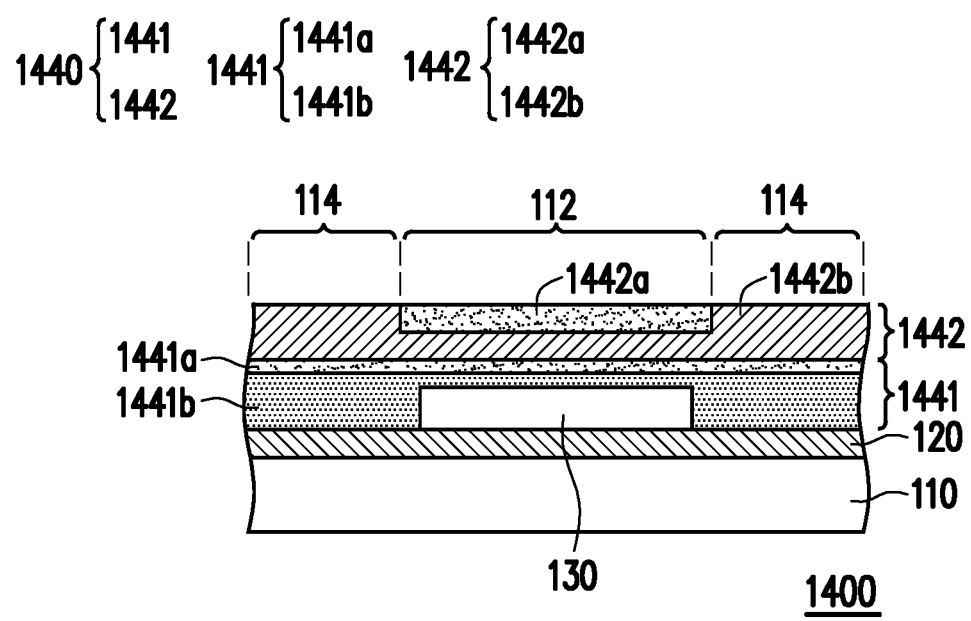
FIG. 14 is a schematic cross-sectional view illustrating a package of electronic device according to a fourteenth embodiment of the disclosure.

FIG. 14 is a schematic cross-sectional view illustrating a package of electronic device according to a fourteenth embodiment of the disclosure. A package of electronic device 1400 of the fourteenth embodiment is similar to the package of electronic device 1300 of FIG. 13. In FIG. 14, like or similar reference numerals represent like or similar components. Thus, components already described in FIG. 13 will not be described in the following.

In this fourteenth embodiment, the encapsulation layer 1440 of the package of electronic device 1400 may include a first barrier layer 1441 and a second barrier layer 1442, the first barrier layer 1441 may be similar to the first barrier layer 1341 of the thirteenth embodiment. Then, the second barrier layer 1442 is formed on the first barrier layer 1441. The second barrier layer 1442 on the device area 112 may be locally modified by performing such as irradiation, heating, or plasma treatment to improve the barrier properties thereof. The depth of modification of the second barrier layer 1442 may be reduced by decreasing treatment energy and/or treatment time to form a gradient of nitrogen content. A nitrogen content of the second nitrogen-rich area 1442a is higher than a nitrogen content of the second oxygen-rich area 1442b. Compared with the second nitrogen-rich area 1442a, the second oxygen-rich area 1442b located on the light transmitting area 114 and the device area 112 those are near one side of the electronic device 130 has a higher oxygen content and a higher light transmittance than the second nitrogen-rich area 1442a.

Figure 15:
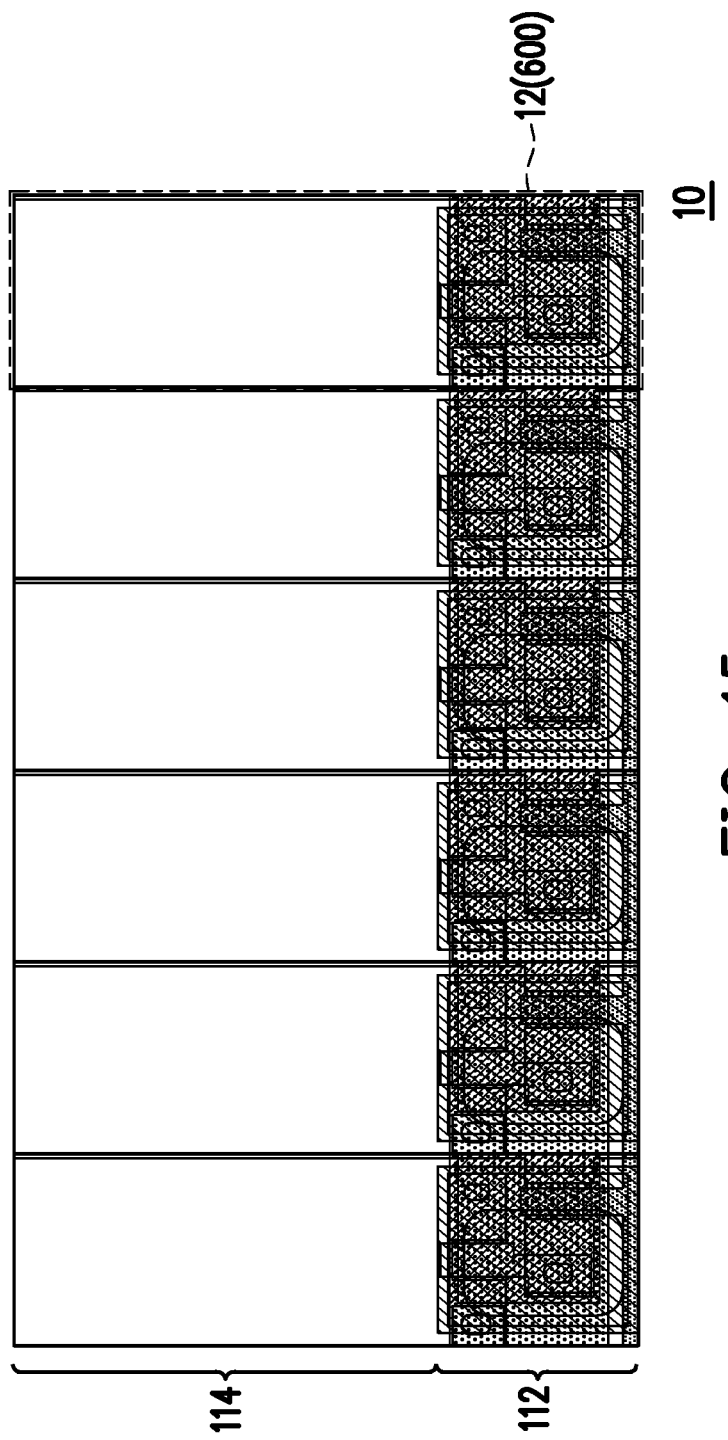
FIG. 15 is a schematic top view illustrating a display panel according to an embodiment of the disclosure.

The package of electronic device according to embodiments of the present disclosure is applicable to, for example, a display panel. FIG. 15 is a schematic top view illustrating a display panel according to an embodiment of the disclosure. A display panel 10 may include a display device 12 and a driving circuit (not shown). The driving circuit is correspondingly disposed on the device area 112 and electrically connected to the display device 12. In the embodiment, taking the display device 12 formed by the package of electronic device 600 as an example, the package of electronic device 600 includes at least one electronic device 130. The at least one electronic device 130 may be, for example, an organic light emitting device. The plurality of packages of electronic device 600 may be arranged according to requirements (for example, array type); or, the number of the at least one electronic device 130 of the package of electronic device 600 is plural, and the position arrangement of the multiple electronic devices 130 may be adjusted as required. In addition, the driving circuit may be horizontally or vertically stacked with the at least one electronic device 130. By modifying the encapsulation layer 640 of the package of electronic device 600 and/or the display device 12 and adopting different treatments for the device area 112 and the light transmitting area 114, the barrier effect may be provided in the device area 112 and a good visible light transmittance is provided in the transmitting area.

In one embodiment, each of the encapsulation layers 140-1440 may have a flat surface, and the devices/films layers may be formed subsequently on the aforementioned flat surface. In other embodiments, the display panel 10 may further include a touch device (not shown). The touch device may be used to detect a signal generated when the user touches the display panel 10. The signal type may be, for example, capacitance change, resistance change, and so on. In another embodiment, the display panel 10 may further include a protective layer (not shown), and the protective layer may be disposed on the aforementioned touch device. The material of the protective layer is, for example, tempered glass, quartz glass, or other suitable materials, and the hardness of the protective layer, for example, higher than 1H may prevent the display panel 10 from being worn or damaged by impact.

The package of electronic device and the display panel according to embodiments of the present disclosure modify the encapsulation layer therein, adopt different treatments for the device area and the light transmitting area, to provide the barrier effect in the device area and provide a good visible light transmittance in the transmitting area. The at least one electronic device and the display panel may have desirable qualities and a good light transmittance.

It will be clear that various modifications and variations can be made to the disclosure. It is intended that the specification and examples be considered as exemplary embodiments only, with a scope of the disclosure being indicated by the following claims and their equivalents.

What is claimed is:
1. A package of electronic device comprising:
a substrate having a device area and a light transmitting area located outside the device area;
at least one electronic device disposed on the device area of the substrate; and an encapsulation layer disposed on the substrate and covering the at least one electronic device, wherein the encapsulation layer extends continuously from the device area to the light transmitting area, and a nitrogen content of the encapsulation layer on the device area is higher than a nitrogen content of the encapsulation layer on the light transmitting area.

2. The package of electronic device as claimed in claim 1, wherein the nitrogen content of the encapsulation layer on the device area is greater than or equal to 7 atomic percent (at %).

3. The package of electronic device as claimed in claim 1, wherein the encapsulation layer has a first nitrogen-rich area and a first oxygen-rich area, the first oxygen-rich area is located on the light transmitting area, and the first nitrogen-rich area is located on the first oxygen-rich area that is on the device area or that is on both the device area and the light transmitting area.

4. The package of electronic device as claimed in claim 1, wherein the encapsulation layer comprises:
   a first barrier layer having a first nitrogen-rich area and a first oxygen-rich area, wherein the first oxygen-rich area is located on the light transmitting area, and the first nitrogen-rich area is located on the first oxygen-rich area that is on the device area or that is on both the device area and the light transmitting area; and
   a second barrier layer disposed on the first barrier layer and having a second nitrogen-rich area and a second oxygen-rich area, wherein the second oxygen-rich area is located on the light transmitting area, and the second nitrogen-rich area is located on the second oxygen-rich area that is on the device area or that is on both the device area and the light transmitting area.

5. The package of electronic device as claimed in claim 1, wherein the encapsulation layer comprises:
   a first barrier layer having a first nitrogen-rich area and a first oxygen-rich area, wherein the first oxygen-rich area is located on the light transmitting area, and the first nitrogen-rich area is located on the first oxygen-rich area that is on the device area or that is on both the device area and the light transmitting area; and
   a second barrier layer disposed on the first barrier layer and having a second nitrogen-rich area and a second oxygen-rich area, wherein the second oxygen-rich area is located on the light transmitting area and the device area those are near one side of the at least one electronic device, and the second nitrogen-rich area is located on the second oxygen-rich area that is on the device area or that is on both the device area and the light transmitting area.

6. The package of electronic device as claimed in claim 1, wherein the encapsulation layer comprises:
   a first barrier layer having a first nitrogen-rich area and a first oxygen-rich area, wherein the first oxygen-rich area is located on the light transmitting area, and the first nitrogen-rich area is located on the first oxygen-rich area that is on the device area or that is on both the device area and the light transmitting area; and
   a second barrier layer disposed on the first barrier layer and having a second nitrogen-rich area and a second oxygen-rich area, wherein the second nitrogen-rich area is located near one side of the at least one electronic device, and the second nitrogen-rich area is located on the second oxygen-rich area.

7. The package of electronic device as claimed in claim 1, wherein the encapsulation layer has a first nitrogen-rich area and a first oxygen-rich area, the first oxygen-rich area is located on the light transmitting area and the device area those are near one side of the at least one electronic device, and the first nitrogen-rich area is located on the first oxygen-rich area that is on the device area or that is on both the device area and the light transmitting area.

8. The package of electronic device as claimed in claim 1, wherein the encapsulation layer comprises:
   a first barrier layer having a first nitrogen-rich area and a first oxygen-rich area, wherein the first oxygen-rich area is located on the light transmitting area and the device area those are near one side of the at least one electronic device, and the first nitrogen-rich area is located on the first oxygen-rich area that is on the device area or that is on both the device area and the light transmitting area; and
   a second barrier layer disposed on the first barrier layer and having a second nitrogen-rich area and a second oxygen-rich area, wherein the second oxygen-rich area is located on the light transmitting area, and the second nitrogen-rich area is located on the second oxygen-rich area that is on device area or that is on both the device area and the light transmitting area.

9. The package of electronic device as claimed in claim 1, wherein the encapsulation layer comprises:
   a first barrier layer having a first nitrogen-rich area and a first oxygen-rich area, wherein the first oxygen-rich area is located on the light transmitting area and the device area those are near one side of the at least one electronic device, and the first nitrogen-rich area is located on the first oxygen-rich area that is on the device area or that is on both the device area and the light transmitting area; and
   a second barrier layer disposed on the first barrier layer and having a second nitrogen-rich area and a second oxygen-rich area, wherein the second oxygen-rich area is located on the light transmitting area and the device area those are near one side of the at least one electronic device, and the second nitrogen-rich area is located on the second oxygen-rich area that is on the the device area or that is on both the device area and the light transmitting area.

10. The package of electronic device as claimed in claim 1, wherein the encapsulation layer comprises:
    a first barrier layer having a first nitrogen-rich area and a first oxygen-rich area, wherein the first oxygen-rich area is located on the light transmitting area and the device area those are near one side of the at least one electronic device, and the first nitrogen-rich area is located on the first oxygen-rich area that is on the device area or that is on both the device area and the light transmitting area; and
    a second barrier layer disposed on the first barrier layer and having a second nitrogen-rich area and a second oxygen-rich area, wherein the second oxygen-rich area is located near one side of the at least one electronic device, and the second nitrogen-rich area is located on the second oxygen-rich area.

11. The package of electronic device as claimed in claim 1, wherein the encapsulation layer comprises:
    a first barrier layer having a first nitrogen-rich area located on the device area and the light transmitting area; and
    a second barrier layer disposed on the first barrier layer and having a second nitrogen-rich area and an oxygen-rich area, wherein the oxygen-rich area is located on the light transmitting area, and the second nitrogen-rich area is located on the oxygen-rich area that is on the device area or that is on both the device area and the light transmitting area.

12. The package of electronic device as claimed in claim 1, wherein the encapsulation layer comprises:
a first barrier layer having a first nitrogen-rich area located on the device area and the light transmitting area; and
a second barrier layer disposed on the first barrier layer and having a second nitrogen-rich area and an oxygen-rich area, wherein the oxygen-rich area is located on the light transmitting area and the device area those are near one side of the at least one electronic device, and the second nitrogen-rich area is located on the oxygen-rich area that is on the device area or that is on both the device area and the light transmitting area.

13. The package of electronic device as claimed in claim 1, wherein the encapsulation layer comprises:
a first barrier layer having a first nitrogen-rich area and a first oxygen-rich area, wherein the first oxygen-rich area is located near one side of the at least one electronic device, and the first nitrogen-rich area is located on the first oxygen-rich area; and
a second barrier layer disposed on the first barrier layer and having a second nitrogen-rich area and a second oxygen-rich area, wherein the second oxygen-rich area is located on the light transmitting area, and the second nitrogen-rich area is located on the second oxygen-rich area that is on the device area or that is on both the device area and the light transmitting area.

14. The package of electronic device as claimed in claim 1, wherein the encapsulation layer comprises:
a first barrier layer having a first nitrogen-rich area and a first oxygen-rich area, wherein the first oxygen-rich area is located near one side of the at least one electronic device, and the first nitrogen-rich area is located on the first oxygen-rich area; and
a second barrier layer disposed on the first barrier layer and having a second nitrogen-rich area and a second oxygen-rich area, wherein the second oxygen-rich area is located on the light transmitting area and the device area those are near one side of the at least one electronic device, and the second nitrogen-rich area is located on the second oxygen-rich area that is on the device area or that is on both the device area and the light transmitting area.

15. The package of electronic device as claimed in claim 1, further comprising a cover layer, wherein the cover layer is located between the at least one electronic device and the encapsulation layer.

16. A package of electronic device comprising:
a substrate having a device area and a light transmitting area located outside the device area;
at least one electronic device disposed on the device area of the substrate; and
an encapsulation layer disposed on the substrate and covering the at least one electronic device, wherein a nitrogen content of the encapsulation layer on the device area is greater than or equal to 7 atomic percent (at %).

17. The package of electronic device as claimed in claim 16, further comprising a cover layer, wherein the cover layer is located between the at least one electronic device and the encapsulation layer.

18. A display panel comprising:
a display device comprising the package of electronic device as claimed in claim 1; and
a driving circuit correspondingly disposed on the device area and electrically connected to the display device.

19. The display panel as claimed in claim 18, further comprising a touch device, wherein the touch device is disposed on the display device.

20. The display panel as claimed in claim 19, further comprising a protective layer, wherein the protective layer is disposed on the touch device.

* * * * *